United States Patent
Ko et al.

(10) Patent No.: US 11,424,163 B2
(45) Date of Patent: Aug. 23, 2022

(54) THREE-DIMENSIONAL ELECTRONIC DEVICE THROUGH ORGANIC SOLVENT PLASTICIZATION PROCESS OF POLYMER FRAME, AND METHOD FOR MANUFACTURING SAME

(71) Applicant: GWANGJU INSTITUTE OF SCIENCE AND TECHNOLOGY, Gwangju (KR)

(72) Inventors: Heung Cho Ko, Gwangju (KR); Gi Gwan Kim, Gwangju (KR); Hun Soo Jang, Gwangju (KR); Seong Hyeon Kang, Gwangju (KR); Yeong Min Kim, Gwangju (KR); Seong Gwang Yoo, Gwangju (KR); Jung Il Yoo, Gwangju (KR)

(73) Assignee: GWANGJU INSTITUTE OF SCIENCE AND TECHNOLOGY, Gwangju (KR)

( * ) Notice: Subject to any disclaimer, the term of this patent is extended or adjusted under 35 U.S.C. 154(b) by 31 days.

(21) Appl. No.: 16/965,187

(22) PCT Filed: Mar. 14, 2019

(86) PCT No.: PCT/KR2019/002969
§ 371 (c)(1),
(2) Date: Jul. 27, 2020

(87) PCT Pub. No.: WO2019/177399
PCT Pub. Date: Sep. 19, 2019

(65) Prior Publication Data
US 2021/0066131 A1    Mar. 4, 2021

(30) Foreign Application Priority Data
Mar. 15, 2018 (KR) .......................... 10-2018-0030484

(51) Int. Cl.
H01L 21/822 (2006.01)
B65H 9/16 (2006.01)
(Continued)

(52) U.S. Cl.
CPC .......... H01L 21/8221 (2013.01); B29C 53/02 (2013.01); B65H 9/163 (2013.01);
(Continued)

(58) Field of Classification Search
CPC ...... Y10S 430/113; Y10S 430/00; C08F 2/06; H01L 2224/81005; H01L 23/4985;
(Continued)

(56) References Cited

U.S. PATENT DOCUMENTS 2,634,248 A * 4/1953 Dazzi ...................... C08L 27/06
524/293
2,710,132 A * 6/1955 Metzger ................. B65D 5/029
229/107
(Continued)

FOREIGN PATENT DOCUMENTS

JP  2016-095498 A  5/2016
KR  10-2012-0003577 A  1/2012
(Continued)

OTHER PUBLICATIONS

Torres et al. Manipulation of the Elastic Modulus of Polymers at the Nanoscale: Influence of UV-Ozone Cross-Linking and Plasticizer. American Chemical Society, vol. 4, No. 9, pp. 5357-5365, 2010 (Year: 2010).*

*Primary Examiner* — Galina G Yushina
(74) *Attorney, Agent, or Firm* — Novick, Kim & Lee, PLLC; Jae Youn Kim; Jihun Kim

(57) ABSTRACT

Provided are a three-dimensional electronic device manufactured through a polymer frame solvent-plasticizing process and a method for manufacturing the three-dimensional
(Continued)

electronic device including a polymer frame configured to have a planar figure-like shape so as to have a polygonal bottom and adjacent surfaces which are formed to be extended from respective edges of the bottom; and a flexible electronic device which is transferred to the polymer frame. The polymer frame is exposed to organic solvent vapor and has a change in Young's modulus.

13 Claims, 7 Drawing Sheets

(51) Int. Cl.
*C08F 2/06* (2006.01)
*B29C 53/02* (2006.01)
*H01L 23/498* (2006.01)
*H01L 29/423* (2006.01)
*B29B 17/02* (2006.01)
*B01F 23/237* (2022.01)

(52) U.S. Cl.
CPC ............ *C08F 2/06* (2013.01); *H01L 23/4985* (2013.01); *H01L 29/42384* (2013.01); *B01F 23/2376* (2022.01); *B29B 2017/0293* (2013.01); *H01L 2224/0344* (2013.01); *H01L 2224/81005* (2013.01); *Y10S 430/00* (2013.01); *Y10S 430/113* (2013.01)

(58) Field of Classification Search
CPC ............ H01L 27/1262; H01L 27/1218; H01L 29/42384; H01L 29/45; H01L 29/16; H01L 29/454; H01L 29/1606; H01L 21/8221; H01L 21/02; H01L 21/3213; H01L 21/32135; H01L 21/02112
See application file for complete search history.

(56) References Cited

U.S. PATENT DOCUMENTS

| | | | | |
|---|---|---|---|---|
| 5,670,614 | A * | 9/1997 | Roby | ............ C08F 6/005 |
| | | | | 528/480 |
| 2010/0002402 | A1* | 1/2010 | Rogers | ............ H05K 1/028 |
| | | | | 361/749 |
| 2015/0359947 | A1* | 12/2015 | Hossainy | ............ C08J 9/00 |
| | | | | 521/182 |
| 2017/0162791 | A1* | 6/2017 | Ko | ............ H01L 51/0017 |

FOREIGN PATENT DOCUMENTS

| | | |
|---|---|---|
| KR | 10-2014-0071284 A | 6/2014 |
| KR | 10-2016-0023601 A | 3/2016 |
| KR | 10-1767245 B1 | 8/2017 |
| KR | 10-2018-0002231 A | 1/2018 |

* cited by examiner

THREE-DIMENSIONAL ELECTRONIC DEVICE THROUGH ORGANIC SOLVENT PLASTICIZATION PROCESS OF POLYMER FRAME, AND METHOD FOR MANUFACTURING SAME

TECHNICAL FIELD

The present invention relates to a three-dimensional electronic device manufactured through a polymer frame organic-solvent-plasticizing process and a method for manufacturing the three-dimensional electronic device, and more specifically, to a method for enabling a planar electronic device to be three-dimensionally transformed.

BACKGROUND ART

A demand for development of a three-dimensional electronic device increases in many fields such as the display field, the sensor field, the energy conversion and storage field, and the circuit design field. The three-dimensional electronic device is more advantageous in optical, electrical, and engineering aspects than a planar device is.

There are two approaches to a technology for manufacturing a three-dimensional device. One is a direct manufacturing method of directly manufacturing a three-dimensional structure and an electronic device by 3D printing or the like, and the other is an indirect manufacturing method of transforming a planar electronic device to have a three-dimensional structure. Despite the advanced development of the processing technology, it is difficult for a device manufactured by the direct manufacturing method to have as high performance as a planar device has, whereas in the indirect manufacturing method, an existing planar semiconductor process is introduced such that a high-performance electronic device can be developed to have a three-dimensional structure.

An existing planar electronic device is put on a hard substrate; however, recently, an acceleration in fusion or convergence between technologies such as the nanotechnology, the biotechnology, the information and communication technology, or the energy and environmental technology causes the electronic device to be developed to have a shape of a human-friendly head-mounted display, electronic paper, a flexible display, or a skin-like electronic device which are bendable and foldable and are as lightweight and soft as possible to be wearable on a human body.

Up to recently, a flexible electronic device has been developed by a method in which a material is subjected to thinning to have a thin film shape or the electronic device is manufactured of a solution which forms a thin film on a substrate through a method of coating, printing, or the like. The flexible electronic device is manufactured of a fragile ceramic material subjected to thinning to have a thin film shape; however, a problem arises in that the flexible electronic device is bendable only to a certain extent and a lack of mechanical and electrical characteristics thereof is too remarkable to be used as an electronic device.

In order to solve the problem, a thin film can be manufactured of graphene as a material to have maximum softness, the graphene being obtained by thinning graphite to a level of atomic layer. Hence, when the graphene is folded, the curvature radius of the graphene at a folded part can be reduced to 0.4 mm. A C—C bond of graphene is expected not to be broken, even when the curvature radius of the folded part is reduced to a level of angstrom; however, actually, softness of a thin film is rapidly degraded due to stress generated at an interface between a substrate and a graphene thin film.

Specifically, even when a solid material such as graphene is subjected to thinning to become an ultra-thin film as thin as an atomic layer, this needs to be laminated on the substrate so as to be used, and at that point, a problem arises in that softness and electrical characteristics of the ultra-thin film are remarkably degraded due to stress generated at the interface of the folded part by interaction between the substrate and the ultra-thin film.

Korean Patent No. 10-1767245 provides an attempt to solve the problem of degradation of softness and electrical characteristics such as a signal transmission delay by providing a liquid film between a substrate and a thin film so as to further improve softness and electrical characteristics and to suppress interface stress at a folded part when a composite thin film is bent.

However, in order to three-dimensionally transform a planar electronic device, a substrate and the device having a ultra-thin film structure are folded at a certain angle or larger.

The problem of degradation of conductance due to breaking of the substrate or fractures in the device which are produced depending on the folding angle is not solved.

CITATION LIST

Patent Literature

[Patent Literature 1]

SUMMARY OF INVENTION

Technical Problem

An object of the present invention to solve the problem is to provide a method for three-dimensionally transforming a polymer frame and an electronic device deposited on the polymer frame by exposing the polymer frame to organic solvent vapor.

Technical objects to be achieved by the present invention are not limited to the technical object mentioned above, and the following description enables additional unmentioned technical objects to be clearly understood by a person of ordinary skill in the art to which the present invention belongs.

Solution to Problem

According to the present invention to achieve the above-described object, a configuration includes: a polymer frame configured to have a planar figure-like shape to have a polygonal bottom and a plurality of polygonal adjacent surfaces which abut on any one of edges of the bottom; and a flexible electronic device which is transferred to the polymer frame. The polymer frame is exposed to organic solvent vapor and has a change in Young's modulus.

In an embodiment of the present invention, the adjacent surfaces are folded at a predetermined angle.

In the embodiment of the present invention, the adjacent surfaces are formed into a triangular shape and are folded such that the polymer frame is formed into a pyramid shape.

In the embodiment of the present invention, the adjacent surfaces are formed into a polygonal shape similar to the shape of the bottom and are folded such that the polymer frame is formed into a polyhedral shape.

In the embodiment of the present invention, the polymer frame has a difference in thickness distribution, and a thickness of the polymer frame is thinner at a folded portion than a thickness thereof at an unfolded portion.

The present invention to achieve the above-described object is configured to include: a) a step of preparing a flexible electronic device; b) a step of preparing a polymer frame; c) a step of transferring the flexible electronic device to the polymer frame via water-soluble tape; d) a step of plasticizing the polymer frame by dissolving the water-soluble tape and exposing the polymer frame to organic solvent vapor; and e) a step of folding the polymer frame and the flexible electronic device into a three-dimensional shape.

In another embodiment of the present invention, the step of a) includes: f) a step of transferring silicon to a glass substrate by a dry transfer printing method; g) a step of forming an insulation layer by coating the glass substrate with polyimide (PI); h) a step of patterning a via in the polyimide (PI) by a dry etching method; and i) a step of configuring a circuit by performing coating with and depositing of an electrode material.

In the other embodiment of the present invention, the glass substrate is coated with PI and $GeO_x$.

The other embodiment of the present invention further includes j) a step of forming a protective layer by performing coating with PI after the step of i).

The other embodiment of the present invention further includes a step of removing the $GeO_x$ layer after the step of j).

In the other embodiment of the present invention, the electrode material is made of any one of conductive metals or a mixed metal thereof, a metallic element-based material, a carbon-based material, conductive nanomaterial containing graphene, conductive polymers or a mixed material thereof so as to configure an electrode circuit.

In the other embodiment of the present invention, the step of b) includes: a step of manufacturing the polymer frame having a thickness distribution; a step of plasticizing the polymer frame by exposing the polymer frame to organic solvent vapor; and a step of forming a soft layer on a surface of the polymer frame.

In the other embodiment of the present invention, the polymer frame contains any one polymer material selected from the group consisting of acrylonitrile butadiene styrene, poly methyl methacrylate, polyacrylate, polyallylate, polyimide, polyamide, polyamideimide, polycarbonate, polyethylene, polypropylene, polyurethane, polyester, polystyrene, polymethylsilsesquioxane, polyethylene oxide, polyacrylonitrile, polyvinylidene fluoride, polyvinylchloride, polyethersulphone, polyetherimide, polyetheretherketone, polybutadieneterephtalate, polyethylene terephthalate, cellulose triacetate, cellulose acetate propionate, polyisocyanurate, polymethylsilsesquioxane, polyphenylene sulfide, and polyethylene naphthalate.

Examples of a plasticizing solvent includes any one selected from the group consisting of acetaldehyde, acetic acid, acetone, acetonitrile, acetophenetidin, acetophenone, acetylacetone, acetyl chloride, acetyl nitrite, acetylnitrile, acetylonitrile, allyl alcohol, allyl chloride, amines, ammonia, ammonium fluoride, amyl acetate, amyl chloride, aniline, aniline chlorohydrate, aqua regia, aromatic hydrocarbons, asphalt, benzaldehyde, benzene, benzenesulfonic acid, benzyl acetate, benzyl alcohol, benzyl chloride, bromine, butadiene, butane, butyl acetate, butyl acrylate, butyl alcohol, butyl chloride, butyl ether, butyl phenol, boron fluids, bromoform, bromotoluene, butadiene-2,4-p-methoxy, butyl phthalate, butylene, butyric acid, calcium bisulfide, calcium chloride, calcium hydroxide, calcium hypochlorite, camphor oil, carbon monoxide, carbon disulfide, carbon tetrachloride, caustic soda, chloric acid, chlorine, chloroacetic acid, chlorobenzene, chloroform, chlorosulfonic acid, chrome alum, chromic acid, copper cyanide, copper fluoborate, creosols, creosylic acid, cresol, cyclohexane, cyclohexanol, cyclohexanone, decahydronaphthalene, di(butoxyethyl) phthalate, dibutyl phthalate, dichloroethane, dichlorobenzene, dichloroethylene, diethyl ether, diethylamine, dimethylamine, dimethylformamide, dioctyl phthalate, ethers, ethyl acetate, ethyl alcohol, ethylbenzene, ethyl ether, ethylene chloride, ethylene chlorohydrin, ethylenediamine, ethylene glycol, ethylene oxide, fatty acids, fluorine gas, formaldehyde, Freon 12, furfuryl alcohol, gasoline, gelatin, glucose, glycerine, heptane, hydrobromic acid, hydrochloric acid, hydrocyanic acid, hydrofluoric acid, hydrogen peroxide, hydrogen sulfide, iodine, isobutane, isopropyl acetate, isopropyl alcohol, isopropyl ether, lactic acid, lanolin, lead acetate, linseed oil, magnesium chloride, magnesium salts, mercury salts, methane, methyl acetate, methyl alcohol, methylamine, methyl bromide, methylene chloride, methylsulfuric acid, morpholine, naphtha, naphthalene, nickel nitrate, nitric acid, nitrobenzene, oleic acid, olive oil, oxygen gas, ozone, palmitic acid, paraffin, perchloric acid, perchloroethylene, petroleum, phenylhydrazine, phosgene gas, phosgene liquid, phosphoric acid, phosphorus trichloride, phosphorus oxychloride, phosphorus pentachloride, potassium bicarbonate, potassium borate, potassium bromate, potassium bromide, potassium carbonate, potassium chloride, potassium cyanide, potassium ferricyanide, potassium perchlorate, potassium permanganate, potassium persulfate, potassium sulfate, propane, propanol, propargyl alcohol, propionic acid, propyl alcohol, propylene oxide, pyridine, silicone oil, silver nitrate, sodium acetate, sodium benzoate, sodium bicarbonate, sodium bisulfate, sodium bisulfite, sodium chlorate, sodium chloride, sodium chromate, sodium ferrocyanide, sodium hypochlorite, sodium iodide, sodium oxalate, sodium phosphate, sodium sulfide, stannous chloride, stearic acid, sulfur dioxide, sulfuric acid, sulfurous acid, tartaric acid, tetrachloroethane, tetraethyl lead, tetrahydrofuran, thionyl chloride, toluene, transformer oil, trichloroacetic acid, trichloroethylene, triethanolamine, triethylamine, turpentine, urea, uric acid, Vaseline, vinyl acetate, deionized water, xylene, and zinc salts, and a solvent containing any one thereof as a component.

Advantageous Effects of Invention

According to the configurations described above, the present invention has the following effects. The Young's modulus of a polymer frame is temporarily changed through an organic solvent-based plasticization process such that the polymer frame can have both hardness suitable for maintaining a shape and softness for preventing the polymer frame from being broken even with a change in shape.

In addition, when the plasticized polymer frame is transformed, the polymer frame functions as a mechanical buffer layer and absorbs stress applied to a device during transformation so as to protect the device during the transformation.

Since the polymer frame protects the device during the transformation, it is possible to prevent conductance of the device from being lowered and maintain electrical characteristics thereof.

A surface of the polymer frame is exposed to organic solvent vapor, and the polymer frame is plasticized before the polymer frame and the device are coupled to each other.

In this manner, a soft layer generated on the surface can improve adhesive strength between the electronic device and the polymer frame.

The effects of the present invention are construed not to be limited to the above-mentioned effects but to include every effect that can be derived from the configurations of the invention described in the detailed description of the embodiments or claims of the present invention.

DESCRIPTION OF PREFERRED EMBODIMENT

A preferred embodiment according to the present invention includes: a polymer frame configured to have a planar figure-like shape to have a polygonal bottom and a plurality of polygonal adjacent surfaces which abut on any one of edges of the bottom; and a flexible electronic device which is transferred to the polymer frame. The polymer frame is exposed to organic solvent vapor and has a change in Young's modulus.

DESCRIPTION OF EMBODIMENTS

Hereinafter, the present invention will be described with reference to the accompanying drawings. However, the present invention can be realized as various different embodiments and, thus, is not limited to embodiments described here. Besides, a part irrelevant to the description is omitted from the drawings in order to clearly describe the present invention, and similar reference signs are assigned to similar parts through the entire specification.

In the entire specification, a case where a certain part "is connected to (accesses, is in contact with, or is coupled to)" another part includes not only a case where the parts are "directly connected" to each other, but also a case where the parts are "indirectly connected" to each other with another member interposed therebetween. In addition, a case where a certain part "includes" a certain configurational element means that another configurational element is not excluded but can be further included, unless specifically described otherwise.

Terms used in this specification are only used to describe a specific embodiment and are not intentionally used to limit the present invention. A word having a singular form includes a meaning of its plural form, unless obviously implied otherwise in context. In this specification, words such as "to include" or "to have" are construed to specify that a feature, a number, a step, an operation, a configurational element, a member, or a combination thereof described in the specification is present and not to exclude presence or a possibility of addition of one or more additional features, numbers, steps, operations, configurational elements, members, or combinations thereof in advance.

Hereinafter, the present invention will be described in detail with reference to the accompanying drawings.

Figure 1:
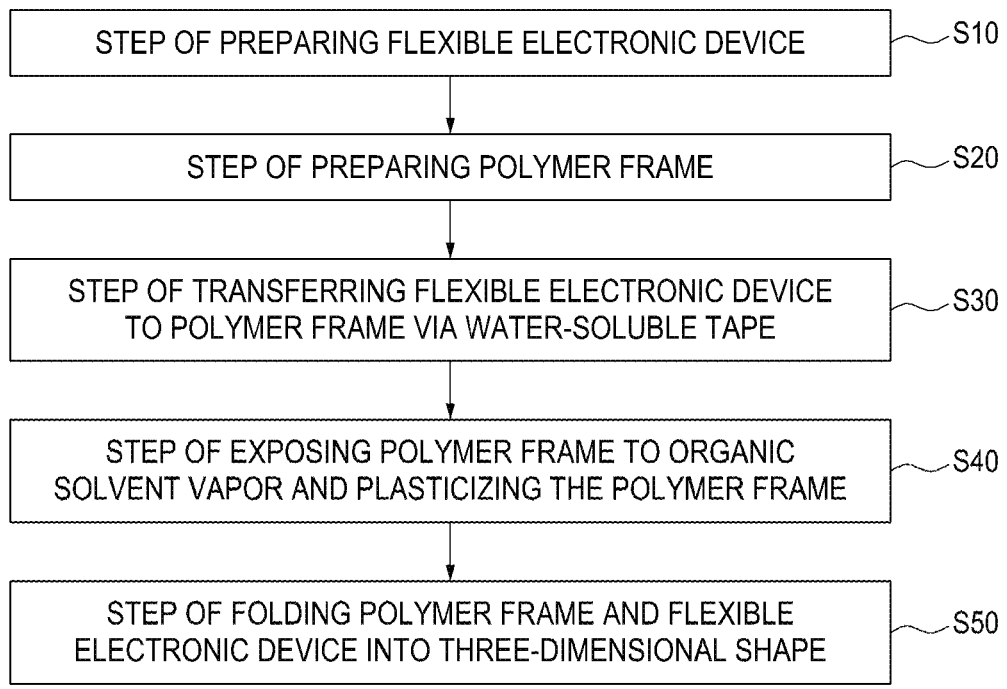
FIG. 1 is a flowchart of a process of realizing a three-dimensional electronic device manufactured through an organic solvent plasticization process according to an embodiment of the present invention.
Figure 2:
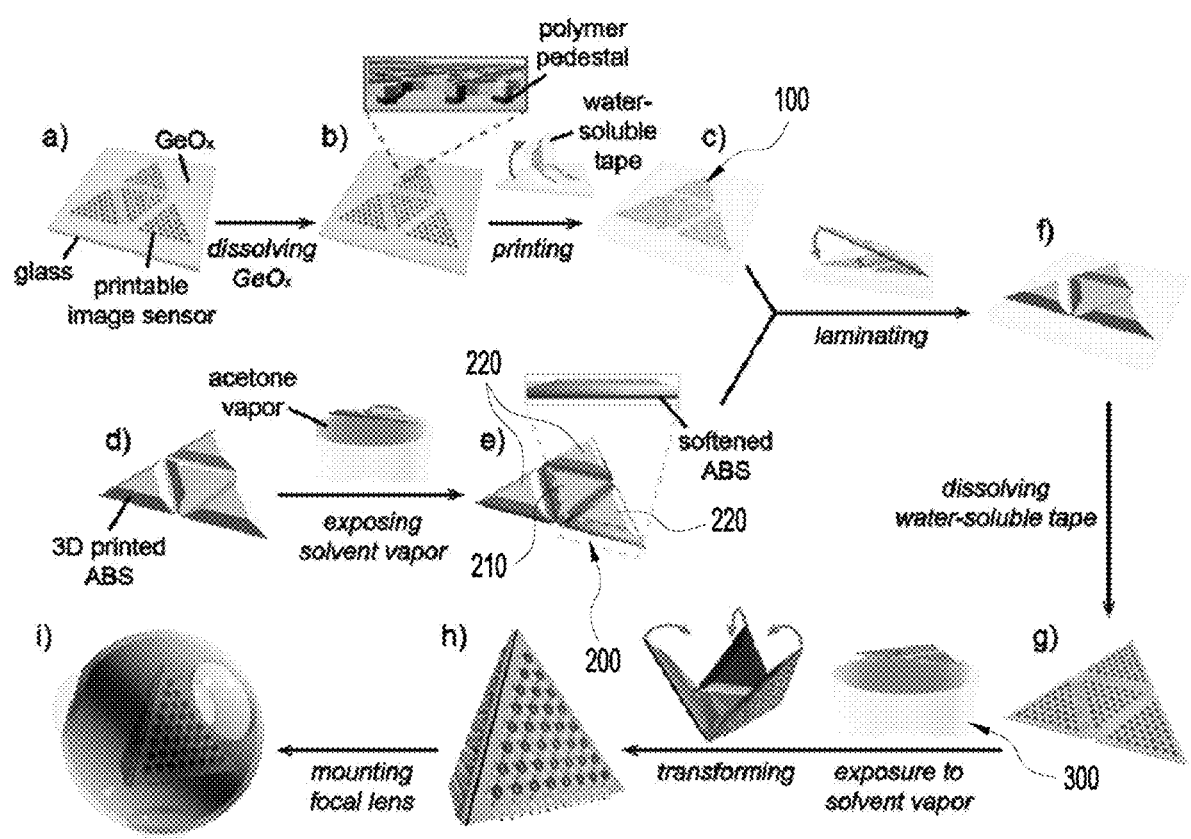
FIG. 2 is a schematic view of the process of realizing the three-dimensional electronic device manufactured through the organic solvent plasticization process according to the embodiment of the present invention.
Figure 3:
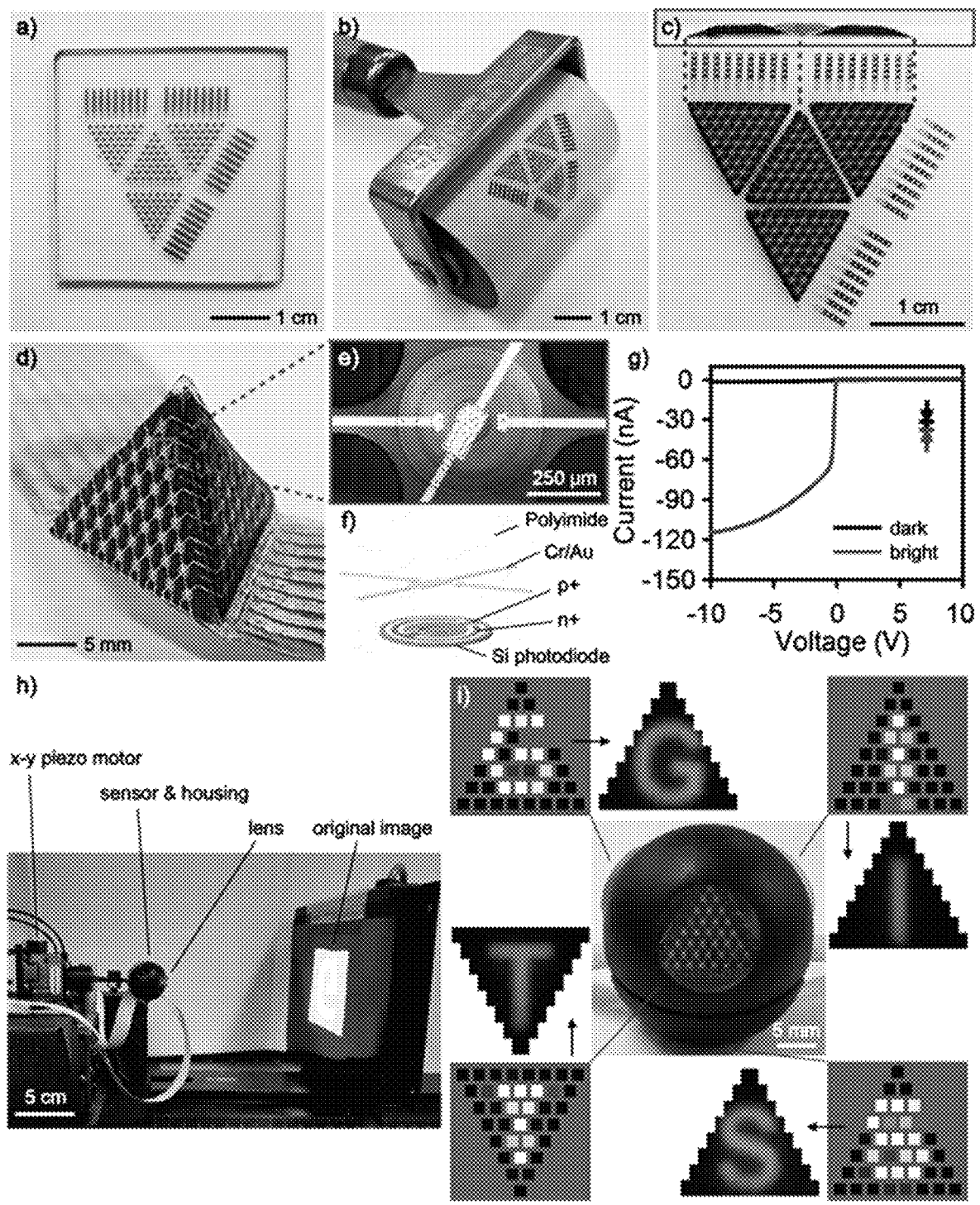
FIG. 3 is a view illustrating a tetrahedral image sensor realized by using a method for realizing a three-dimensional electronic device manufactured through an organic solvent plasticization process according to another embodiment of the present invention.
Figure 4:
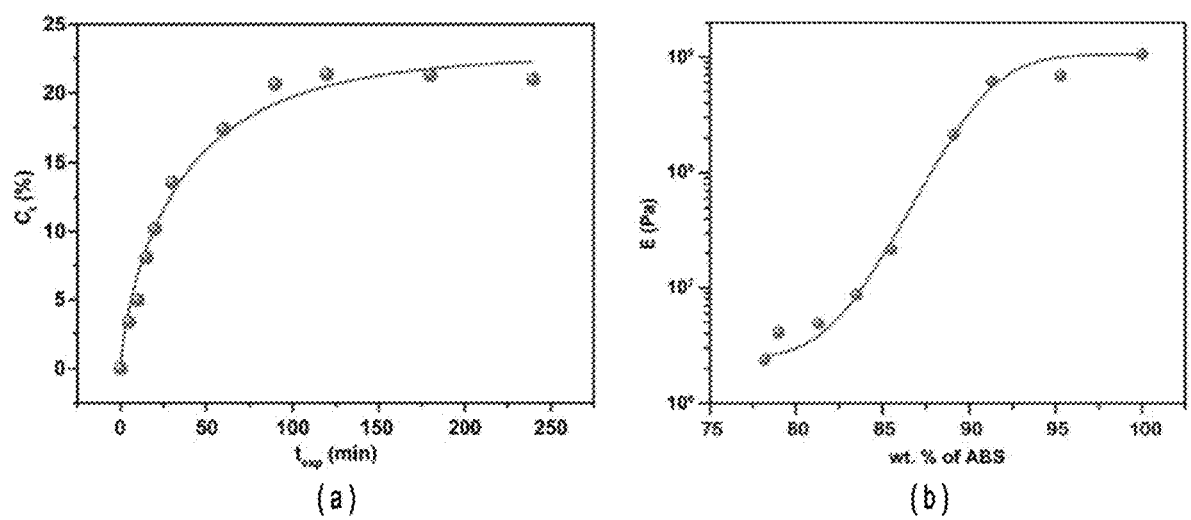
FIG. 4 illustrates graphs showing an amount of a solvent infiltrating a polymer substrate with the elapse of solvent processing time and a change in Young's modulus of the polymer substrate depending on the amount thereof, when the polymer substrate is subjected to solvent vapor processing, according to the other embodiment of the present invention.
Figure 5:
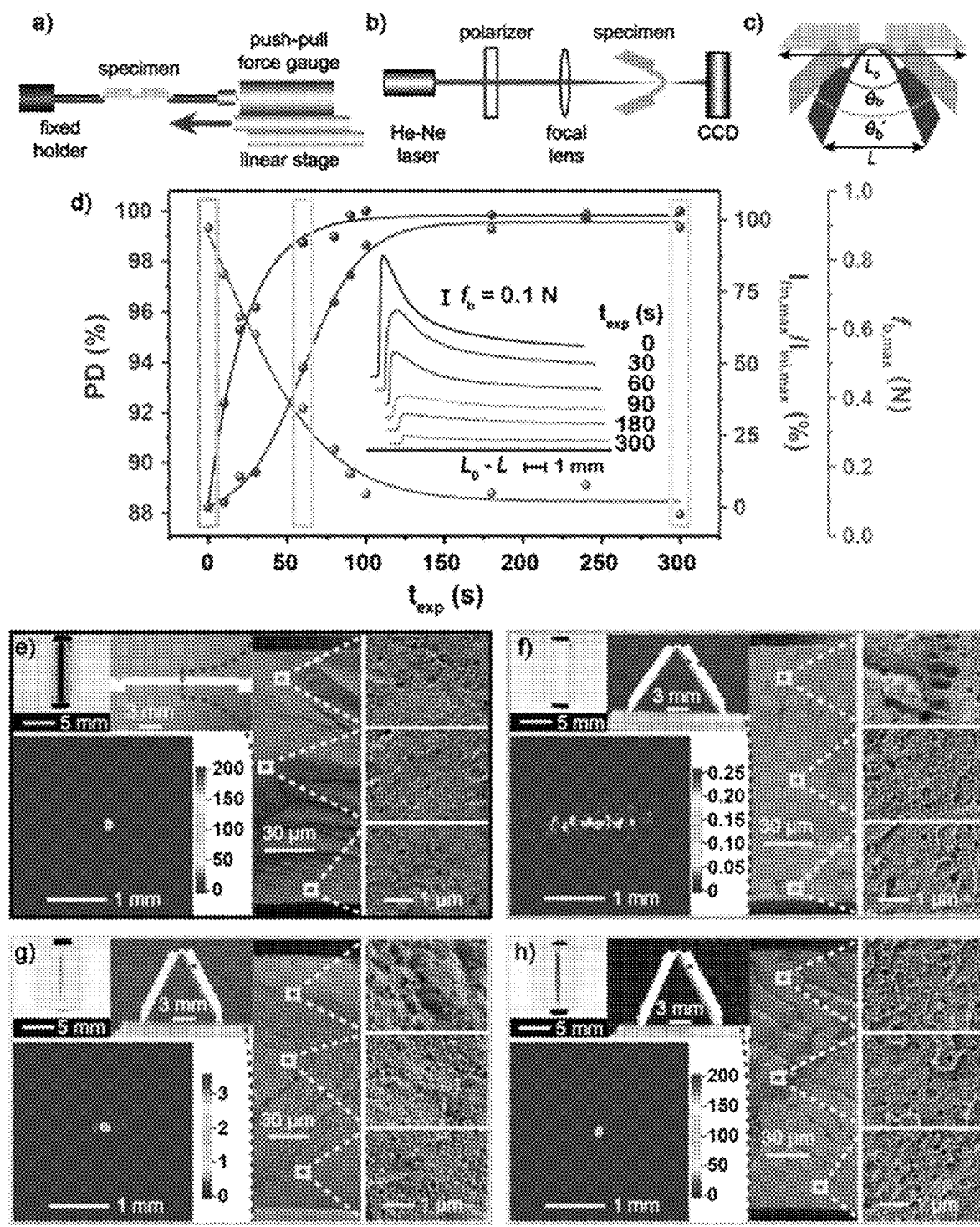
FIG. 5 illustrates a graph showing a degree of plasticization of a polymer frame by organic solvent vapor processing according to the other embodiment of the present invention.
Figure 6:
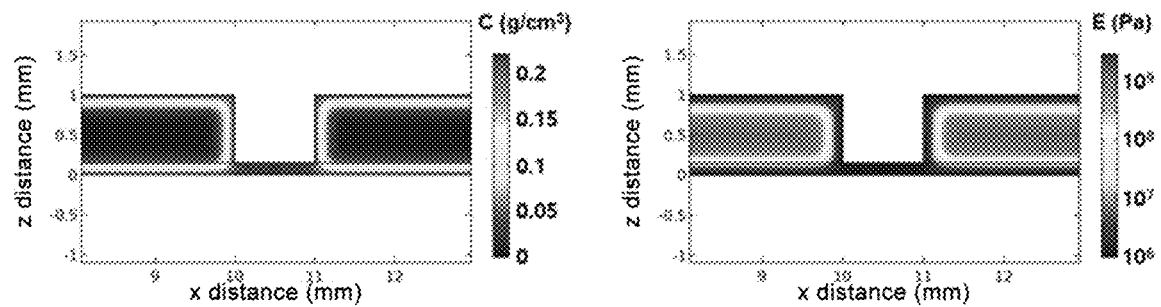
FIG. 6 illustrates graphs obtained from simulation showing how Young's modulus of a polymer frame changes when the polymer frame having a thickness distribution is plasticized according to the other embodiment of the present invention.
Figure 7:
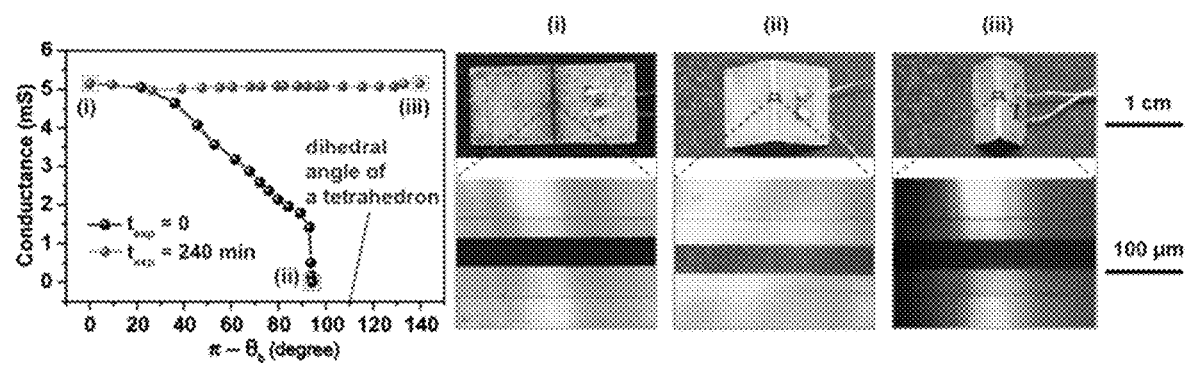
FIGS. 7 and 8 illustrate graphs showing whether an electrode on a polymer frame is protected according to a bending angle depending on whether the polymer frame is plasticized, according to the other embodiment of the present invention.
Figure 8:
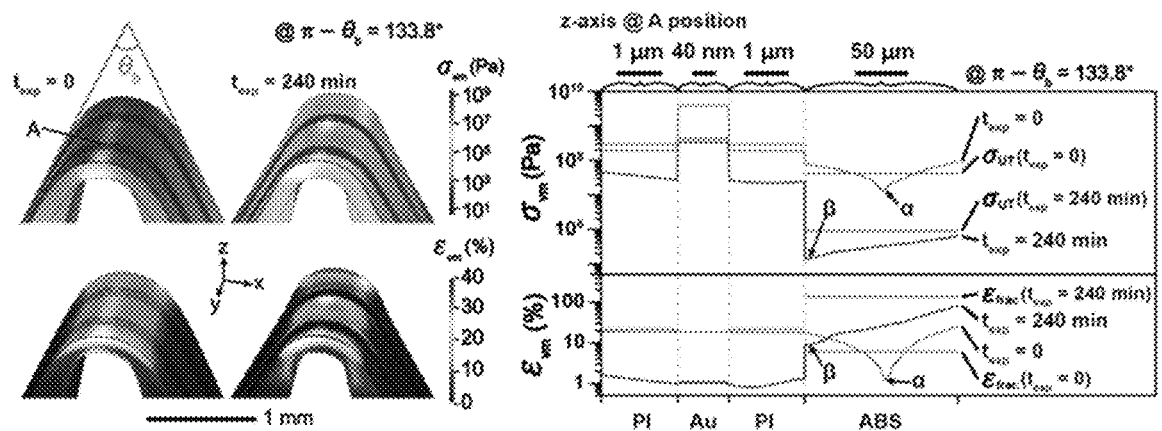
Figure 9:
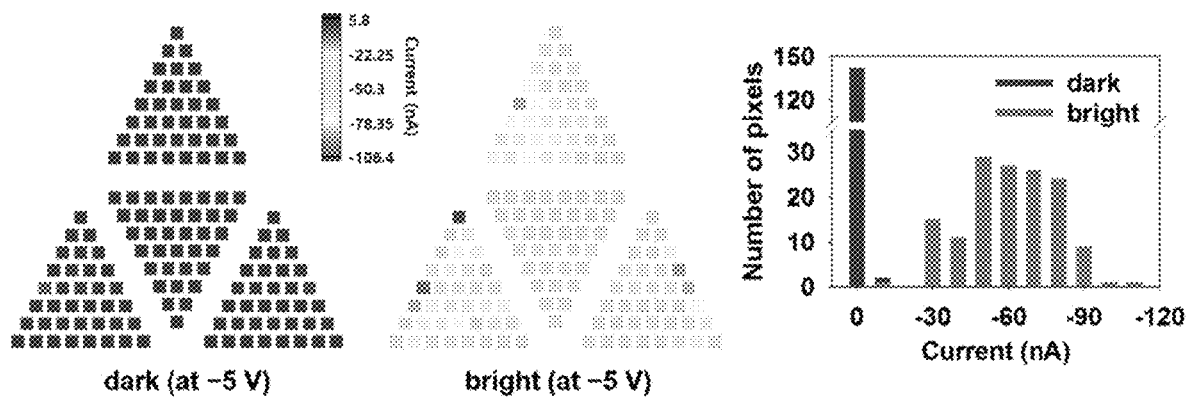
FIG. 9 illustrates graphs of a yield of the three-dimensional electronic device manufactured through the organic solvent plasticization process according to the other embodiment of the present invention.

FIG. 1 is a flowchart of a process of realizing a three-dimensional electronic device manufactured through an organic solvent plasticization process according to an embodiment of the present invention. FIG. 2 is a schematic view of the process of realizing the three-dimensional electronic device manufactured through the organic solvent plasticization process according to the embodiment of the present invention. FIG. 3 is a view illustrating a tetrahedral image sensor realized by using a method for realizing a three-dimensional electronic device manufactured through an organic solvent plasticization process according to another embodiment of the present invention. FIG. 4 illustrates graphs showing an amount of a solvent infiltrating a polymer substrate with the elapse of solvent processing time and a change in Young's modulus of the polymer substrate depending on the amount thereof, when the polymer substrate is subjected to solvent vapor processing, according to the other embodiment of the present invention. FIG. 5 illustrates a graph showing a degree of plasticization of a polymer frame by organic solvent vapor processing according to the other embodiment of the present invention. FIG. 6 illustrates graphs obtained from simulation to find how Young's modulus of a polymer frame changes when the polymer frame having a thickness distribution is plasticized according to the other embodiment of the present invention. FIGS. 7 and 8 illustrate graphs showing whether an electrode on a polymer frame is protected according to a bending angle depending on whether the polymer frame is plasticized, according to the other embodiment of the present invention. FIG. 9 illustrates graphs of a yield of the three-dimensional electronic device realized through the organic solvent plasticization process according to the other embodiment of the present invention.

As illustrated in FIGS. 1 and 2, according to the embodiments of the present invention, there are provided a three-dimensional electronic device manufactured through a polymer frame solvent-plasticizing process and a method for manufacturing the three-dimensional electronic device configured to include: a polymer frame 200 configured to have a planar figure-like shape so as to have a polygonal bottom 210 and adjacent surfaces 220 which abut on any one of edges of the bottom 210; and a flexible electronic device 100 that is transferred to the polymer frame 200; and an organic solvent 300 that is changed into vapor to which the polymer frame 200 is exposed and that temporarily changes Young's modulus of the polymer frame 200.

In order for a planar electronic device to be three-dimensionally transformed, the flexible electronic device 100 configured of an ultra-thin film structure needs to be used; however, it is difficult for the flexible electronic device to be three-dimensionally transformed and maintain a shape thereof due to a small thickness and softness thereof. Hence, a frame for controlling the shape of the flexible electronic device 100 needs to be introduced; however, while a hard frame having the Young's modulus of 1 GPa or higher is suitable for maintaining the shape with its hardness, it can be broken against insignificant transformation and can have an adverse effect on performance of the device. On the other hand, a soft frame having the Young's modulus of 10 MPa or lower is not broken even with significant transformation, but it is difficult to maintain the shape thereof.

In order to have both the softness and the hardness, the polymer frame 200 is exposed to vapor of the organic solvent 300, and the polymer frame 200 is plasticized.

The flexible electronic device 100 is transferred to the polymer frame 200 via water-soluble tape. At that point, the polymer frame 200 is exposed to vapor of the organic solvent 300, a surface of the polymer frame 200 is plasticized, and thereby adhesive strength between the flexible electronic device 100 and the polymer frame 200 can be improved.

The polymer frame 200 can be printed by a 3D printer, can be configured to have a planar figure-like shape to have the polygonal bottom 210 and adjacent surfaces 220 which are formed to be extended from respective edges of the bottom 210, and can form a three-dimensional polyhedron when the adjacent surfaces 220 are folded.

As an example, when the bottom 210 has a triangular shape and triangular adjacent surfaces 220 are formed from respective edges of the triangular bottom 210, the adjacent surfaces 220 can be folded such that the polymer frame 200 can have a three-dimensional shape of a triangular pyramid.

As another example, when the bottom 210 has a quadrangular shape and the adjacent surfaces 220 formed to be extended from the bottom 210 are formed into the same quadrangular shape as that of the bottom 210 so as to form a planar figure of a hexahedron, the adjacent surfaces 220 can be folded such that the polymer frame 200 can be formed into a hexahedral shape.

In addition, the polymer frame 200 can be folded at a predetermined angle and can be folded to have acute angles between the adjacent surfaces.

The polymer frame 200 has a thickness distribution in which a thickness at a folded portion is thinner than a thickness at an unfolded portion. Hence, when the polymer frame 200 is exposed to vapor of the organic solvent 300 and is plasticized, a thin portion can be softened to be easily folded.

More specifically, when the organic solvent 300 having a low boiling point is used, a processing temperature can be lowered, a time when the polymer frame 200 is exposed to the vapor can be shortened, and the Young's modulus of the polymer frame 200 exposed to the organic solvent 300 can be lowered such that the polymer frame can become soft to be easily folded and be prevented from being broken. Since, the organic solvent 300 dispersed in the polymer frame 200 is vaporized again at room temperature, the Young's modulus of the polymer frame 200 is restored and the hardness thereof is maintained. In other words, a temporary change in Young's modulus of the polymer frame 200 enables a change of the polymer frame from hardness through softness to hardness.

Acetone can be used as an example of the organic solvent 300.

However, the organic solvent 300 is not limited to acetone and can be any known substance, as long as the substance is a liquid organic chemical which can dissolve a certain substance, is not easily dissolved in water, is volatile, and has high detergency.

When the thickness distribution and the solvent processing time of the polymer frame 200 is appropriately chosen using a phenomenon in which the polymer frame 200 is exposed to the organic solvent 300 to have a temporary change in Young's modulus, a plasticized region can be partially formed, and thus it is possible to also control a position at which transformation is induced.

In addition, the polymer frame 200 contains any one polymer material selected from the group consisting of acrylonitrile butadiene styrene, poly methyl methacrylate, polyacrylate, polyallylate, polyimide, polyamide, polyamideimide, polycarbonate, polyethylene, polypropylene, polyurethane, polyester, polystyrene, polymethylsilsesquioxane, polyethylene oxide, polyacrylonitrile, polyvinylidene fluoride, polyvinylchloride, polyethersulphone, polyetherimide, polyetheretherketone, polybutadieneterephtalate, polyethylene terephthalate, cellulose triacetate, cellulose acetate propionate, polyisocyanurate, polymethylsilsesquioxane, polyphenylene sulfide, and polyethylene naphthalate.

Examples of a plasticizing solvent includes any one selected from the group consisting of acetaldehyde, acetic acid, acetone, acetonitrile, acetophenetidin, acetophenone, acetylacetone, acetyl chloride, acetyl nitrate, acetylnitrile, acetylonitrile, allyl alcohol, allyl chloride, amines, ammonia, ammonium fluoride, amyl acetate, amyl chloride, aniline, aniline chlorohydrate, aqua regia, aromatic hydrocarbons, asphalt, benzaldehyde, benzene, benzenesulfonic acid, benzyl acetate, benzyl alcohol, benzyl chloride, bromine, butadiene, butane, butyl acetate, butyl acrylate, butyl alcohol, butyl chloride, butyl ether, butyl phenol, boron fluids, bromoform, bromotoluene, butadiene-2,4-p-methoxy, butyl phthalate, butylene, butyric acid, calcium bisulfide, calcium chloride, calcium hydroxide, calcium hypochlorite, camphor oil, carbon monoxide, carbon disulfide, carbon tetrachloride, caustic soda, chloric acid, chlorine, chloroacetic acid, chlorobenzene, chloroform, chlorosulfonic acid, chrome alum, chromic acid, copper cyanide, copper fluoborate, creosols, creosylic acid, cresol, cyclohexane, cyclohexanol, cyclohexanone, decahydronaphthalene, di(butoxyethyl) phthalate, dibutyl phthalate, dichloroethane, dichlorobenzene, dichloroethylene, diethyl ether, diethylamine, dimethylamine, dimethylformamide, dioctyl phthalate, ethers, ethyl acetate, ethyl alcohol, ethylbenzene, ethyl ether, ethylene chloride, ethylene chlorohydrin, ethylenediamine, ethylene glycol, ethylene oxide, fatty acids, fluorine gas, formaldehyde, Freon 12, furfuryl alcohol, gasoline, gelatin, glucose, glycerine, heptane, hydrobromic acid, hydrochloric acid, hydrocyanic acid, hydrofluoric acid, hydrogen peroxide, hydrogen sulfide, iodine, isobutane, isopropyl acetate, isopropyl alcohol, isopropyl ether, lactic acid, lanolin, lead acetate, linseed oil, magnesium chloride, magnesium salts, mercury salts, methane, methyl acetate, methyl alcohol, methylamine, methyl bromide, methylene chloride, methylsulfuric acid, morpholine, naphtha, naphthalene, nickel nitrate, nitric acid, nitrobenzene, oleic acid, olive oil, oxygen gas, ozone, palmitic acid, paraffin, perchloric acid, perchloroethylene, petroleum, phenylhydrazine, phosgene gas, phosgene liquid, phosphoric acid, phosphorus trichloride, phosphorus oxychloride, phosphorus pentachloride, potassium bicarbonate, potassium borate, potassium bromate, potassium bromide, potassium carbonate, potassium chloride, potassium cyanide, potassium ferricyanide, potassium perchlorate, potassium permanganate, potassium persulfate, potassium sulfate, propane, propanol, propargyl alcohol, propionic acid, propyl alcohol, propylene oxide, pyridine, silicone oil, silver nitrate, sodium acetate, sodium benzoate, sodium bicarbonate, sodium bisulfate, sodium bisulfite, sodium chlorate, sodium chloride, sodium chromate, sodium ferrocyanide, sodium hypochlorite, sodium iodide, sodium oxalate, sodium phosphate, sodium sulfide, stannous chloride, stearic acid, sulfur dioxide, sulfuric acid, sulfurous acid, tartaric acid, tetrachloroethane, tetraethyl lead, tetrahydrofuran, thionyl chloride, toluene, transformer oil, trichloroacetic acid, trichloroethylene, triethanolamine, triethylamine, turpentine, urea, uric acid, Vaseline, vinyl acetate, deionized water, xylene, and zinc salts, and a solvent containing any one thereof as a component.

The flexible electronic device 100 is manufactured based on a silicon photodiode. A manufacturing method is as follows. Silicon doped on silicon-on-insulator (SOI) is transferred by a dry transfer printing method to a glass substrate coated with polyimide (PI) and GeO2, and PI coating is again performed to form an insulation layer. Then, a via is formed in the PI by a dry etching method and an electrode is deposited by sputtering to configure an image sensor circuit.

Subsequently, PI coating is performed to form a protective layer, then, a $GeO_x$ layer is removed, and transferring can be finally performed.

The method for manufacturing the three-dimensional electronic device manufactured through a process of plasticizing the polymer frame 200 with the organic solvent 300 is described based on the above-described configuration.

Step S10 of preparing the flexible electronic device 100 is performed. Here, a step of transferring silicon by a dry transfer printing method to the glass substrate coated with PI and $GeO_x$, a step of forming an insulation layer by coating the glass substrate with PI, a step of patterning the via in the PI by a dry etching method, a step of depositing a metal electrode by sputtering and configuring the circuit, and a step of enabling transferring to be performed to the polymer frame 200 are performed.

The dry etching method means that a part not necessary for forming a circuit pattern is removed using a reaction with gas including activated gas plasmas in micromachining, unlike the wet etching.

Subsequently, a step of performing PI coating to form a protective layer and removing the $GeO_x$ layer is performed.

More specifically, as illustrated in FIG. 2, Step S10 of preparing the flexible electronic device 100 includes processes a to c. The silicon doped on the SOI is transferred to the substrate by the dry transfer printing method, and then PI coating is again performed to form the insulation layer. Then, the via is formed in the PI, the electrode is deposited by sputtering to form a circuit, and the flexible electronic device is transferred to the polymer frame 200 via the water-soluble tape.

Here, examples of an electrode material include conductive metals containing any one element of transition metals (Sc, Y, Ti, V, Cr, Mn, Fe, Co, Ni, Cu, Zr, Nb, Mo, Tc, Ru, Rh, Pd, Ag, Hf, Ta, W, Re, Os, Ir, Pt, Au, Rf, Db, Sg, Bh, and Hs), post-transition metals (Al, Zn, Ga, Cd, In, Sn, Hg, Tl, Pb, Bi, Po, and Cn), metalloids (B, Si, Ge, As, Sb, Te, At, and the like), multi-atomic non-metals (C, P, S, Se), alkali metals (Li, Na, K, Rb, Cs, and Fr), alkali earth metals (Be, Mg, Ca, Sr, Ba, and Ra), lanthanides (La, Ce, Pr, Nd, Pm, Sm, Eu, Gd, Tb, Dy, Ho, Er, Tm, Yb, and Lu), actinides (Ac, Th, Pa, U, Np, Pu, Am, Cm, Bk, Cf, Es, Fm, Md, No, and Lr) or a mixed metal having a composition ratio thereof, a quantum dot or nano dot, a nanowire, nanorod, or nanofiber, or 2D materials based on metallic elements such as Au, Ag, Cu, Ni, Pt, Fe, Ti, Co, Nb, Mo, Cr, Zn, Cd, Ge, Mn, Zr, Pd, W, and Si, a carbon-based zero-dimensional material (fullerene or graphene quantum dot) or one-dimensional material (carbon nanowire/nanotube/nanofiber), a conductive nanomaterial containing graphene, or a conductive polymer containing any one selected from the group consisting of polyacetylene, polyaniline, polypyrrole, polythiophene, poly(3,4-ethylenedioxythiophene), polyisothianaphthene, polyphenylene vinylene, polyphenylene, polythienylene-vinylene, polyphenylenesulfide, polysulfur nitride, polypyridine, polyazulene, polyindole, polycarbazole, polyazine, polyquinone, polyfuran, polynaphthalene, polyazepine, polyselenophene, polytellurophene, poly(2-methoxy-5-(2'-ethyl)hexyloxy-p-phenylenevinylene, polyisothian naphthalene, poly(3,4-ethylenedioxythiophene)-tetramethacrylate, poly(3-hexylthiophene), poly(3-octylthiophene), and poly butylthiophene or a mixed material thereof, and the electrode material configures the electrode circuit.

Step S20 of preparing the polymer frame 200 is performed. At that point, a step of manufacturing the polymer frame having the thickness distribution, a step of plasticizing the polymer frame 200 by exposing the polymer frame to the vapor of the organic solvent 300, and a step of causing a soft layer to be formed on the surface of the polymer frame 200 are performed.

More specifically, as illustrated in FIG. 2, Step S20 of preparing the polymer frame 200 includes processes d and e.

The polymer frame 200 is manufactured using a 3D printer and is exposed to the vapor of the organic solvent 300 and a surface of the polymer frame 200 is plasticized before the flexible electronic device 100 is transferred such that the soft layer is generated and has an effect of improving adhesive strength between the flexible electronic device 100 and the polymer frame.

Then, Step S30 of transferring the flexible electronic device 100 to the polymer frame 200 via the water-soluble tape is performed. As illustrated in FIG. 2, Step S30 is the same as a process f.

Then, Step S40 of plasticizing the polymer frame 200 by dissolving the water-soluble tape and exposing the polymer frame to the vapor of the organic solvent 300 is performed.

Then, Step S50 of causing the polymer frame 200 and the flexible electronic device 100 to be folded into a three-dimensional shape is performed.

More specifically, as illustrated in FIG. 2, Step S40 of plasticizing the polymer frame 200 to which the flexible electronic device 100 is transferred, by exposing the polymer frame to the vapor of the organic solvent 300 and Step S50 of causing the plasticized polymer frame 200 and the flexible electronic device 100 to be folded into a three-dimensional shape include processes g and h.

When the polymer frame 200, to which the flexible electronic device 100 is transferred, is exposed to the vapor of the organic solvent 300, the Young's modulus of the polymer frame 200 is lowered and the polymer frame is softened. At that point, when the polymer frame 200 is folded, the flexible electronic device 100 is folded together with the polymer frame, and the polymer frame 200 absorbs stress applied to the flexible electronic device 100 to protect the flexible electronic device 100. As time passes, the organic solvent 300 dispersed in the polymer frame 200 is vaporized again, the Young's modulus of the polymer frame 200 is restored, and the polymer frame is hardened.

FIG. 3 illustrates a view illustrating a tetrahedral image sensor realized by using the method.

A spherical housing designed to mount a lens for optical measurement of a completed tetrahedral image sensor thereon was prepared by a 3D printing method. As illustrated in FIG. 9, the device has a high yield of 99.3% (143/144). The high yield indicates that a plasticized polymer frame can reliably protect the device.

Hereinafter, desirable experimental examples will be provided for better understanding of the present invention. However, the following experimental examples are provided only for better understanding of the present invention, and the present invention is not limited to the following experimental examples.

<Experimental Example 1: Effects of Exposure to Organic Solvent>

FIG. 4 illustrates graphs for checking effects of organic solvent processing. FIG. 4(*a*) is a graph illustrating an amount of the organic solvent 300 (acetone) vaporized from a 50° C. beaker infiltrating the frame as time passes. The amount of the organic solvent 300 infiltrating the polymer frame 200 can be measured by a difference between weight of the initial polymer frame 200 and weight of the polymer frame 200 subjected to vapor processing of the organic solvent 300. An infiltrating amount increases depending on a processing time of the organic solvent 300, and it is possible to confirm that the infiltrating amount is maintained constant at about 24% of the weight of the entire frame.

FIG. 4(*b*) is a graph illustrating a change in Young's modulus of the frame subjected to the processing of the organic solvent 300. The Young's modulus of the polymer frame 200 can be measured from an inclination of a stress-strain graph measured by a universal testing machine. It is possible to confirm that the Young's modulus of the frame changes by 700 times or more depending on a content ratio of the organic solvent 300.

<Experimental Example 2: Degree of Plasticization of Polymer Frame Depending on Exposure Time to Organic Solvent>

FIG. 5 illustrates a graph showing a degree of plasticization of the polymer frame 200 by the organic solvent vapor processing. It is possible to confirm that when the plasticized polymer frame 200 is transformed, ultimate stress/strain of the frame is lowered and breaking is not found from samples 60S and 300S (bath=75° C.), by a scanning electron microscope, a transmitted laser beam light intensity distribution, and pictures.

<Experimental Example 3: Stress and Strain of Electrode on Polymer Frame Depending on Whether Polymer Frame is Plasticized>

FIGS. 6 to 8 illustrate stress and strain of the electrode on the polymer frame depending on whether the polymer frame is plasticized. Regarding effects of the thickness distribution of the frame on Young's modulus distribution, the frame can have the Young's modulus distribution because of a difference in time taken to plasticize a thick portion and a thin portion. Effects of the plasticized polymer frame 200 on the electronic device were analyzed using a Comsol simulation and actual samples. A general electrode material has the Young's modulus of 10 GPa or higher, and fractures appear at very low critical strain of 0.2%. When the unplasticized polymer frame 200 is transformed, strain applied to the electrode on the frame is higher than the critical strain, and thus fractures appear at the electrode and result in a decrease in conductance. On the other hand, when the plasticized polymer frame is transformed, the plasticized frame absorbs strain such that negligible strain is applied to the electrode, and thereby it is possible to check that the electrode is protected. The simulation is performed with a viscoplastic model.

The description of the present invention described above is provided as an example, and a person of ordinary skill in the art to which the present invention belongs can understand that it is possible to easily modify the present invention to another embodiment without changing the technical idea or an essential feature of the present invention. Therefore, the embodiments described above need to be understood as exemplified embodiments in every aspect and not as limiting embodiments. For example, configurational elements described in a singular form can be realized in a distributed manner. Similarly, the configurational elements described in the distributed manner can be realized in a combined manner.

The scope of the present invention needs to be represented by the claims to be described below, and meaning and the scope of the claims and every modification or modified embodiment derived from an equivalent concept of the claims need to be construed to be included in the scope of the present invention.

REFERENCE SIGNS LIST

100 FLEXIBLE ELECTRONIC DEVICE
200 POLYMER FRAME
210 BOTTOM 220 ADJACENT SURFACE
300 ORGANIC SOLVENT

The invention claimed is:

1. A three-dimensional electronic device manufactured through a polymer frame solvent-plasticizing process, which, in an initial stage of manufacturing, comprised a polymer frame configured to have a planar figure-like shape, including a polygonal bottom and a plurality of polygonal adjacent side surfaces each abutting a corresponding side of the polygonal bottom,
   the three-dimensional electronic device comprising a three-dimensional polymer frame with a flexible electronic device transferred to a softened polymer frame,
   wherein the three-dimensional polymer frame has Young's modulus different from those of the initial planar figure-like polymer frame.

2. The three-dimensional electronic device manufactured through the polymer frame solvent-plasticizing process according to claim 1,
   wherein, in the three-dimensional electronic device, each of adjacent surfaces initially disposed on a plane, is folded at a predetermined angle.

3. The three-dimensional electronic device manufactured through the polymer frame solvent-plasticizing process according to claim 2,
   wherein the adjacent surfaces of the planar figure-like polymer frame are formed into a triangular shape and in the three-dimensional polymer frame, they are folded such that the polymer frame is formed into a pyramid shape.

4. The three-dimensional electronic device manufactured through the polymer frame solvent-plasticizing process according to claim 2,
   wherein the adjacent surfaces of the planar figure-like polymer frame are shaped into a polygonal shape and in the three-dimensional polymer frame, they are folded such that the polymer frame is formed into a polyhedral shape.

5. The three-dimensional electronic device manufactured through the polymer frame solvent-plasticizing process according to claim 1,
wherein before folded into a three-dimensional shape, the polymer frame had a difference in a thickness distribution, being thinner at folded portions.

6. A method for manufacturing a three-dimensional electronic device through a polymer frame solvent-plasticizing process, the method comprising:
a) preparing a flexible electronic device;
b) preparing a polymer frame configured to have a planar figure-like shape, including a polygonal bottom and a plurality of polygonal adjacent side surfaces each abutting a corresponding side of the polygonal bottom;
c) transferring the flexible electronic device to a softened polymer frame via water-soluble tape;
d) plasticizing the polymer frame by dissolving the water-soluble tape and exposing the polymer frame to organic solvent vapor; and
e) folding the polymer frame with the flexible electronic device into a three-dimensional shape,
wherein the three-dimensional polymer frame has Young's modulus different from those of the initial planar figure-like polymer frame.

7. The method for manufacturing the three-dimensional electronic device through the polymer frame solvent-plasticizing process according to claim 6,
wherein the step a) includes:
f) transferring silicon to a glass substrate by a dry transfer printing;
g) forming an insulation layer by coating the glass substrate with polyimide (PI);
h) patterning a via in the polyimide (PI) by a dry etching; and
i) configuring a circuit by performing coating with or depositing of an electrode material.

8. The method for manufacturing the three-dimensional electronic device through the polymer frame solvent-plasticizing process according to claim 7,
wherein the glass substrate is coated with PI and $GeO_x$.

9. The method for manufacturing the three-dimensional electronic device through the polymer frame solvent-plasticizing process according to claim 8, further comprising:
j) forming a protective layer by performing coating with PI after the step i).

10. The method for manufacturing the three-dimensional electronic device through the polymer frame solvent-plasticizing process according to claim 9, further comprising:
removing the $GeO_x$ layer after the step of j).

11. The method for manufacturing the three-dimensional electronic device through the polymer frame solvent-plasticizing process according to claim 7,
wherein the electrode material is any one of conductive metals or a mixed metal thereof, a metallic element-based material, a carbon-based material, conductive nanomaterial containing graphene, conductive polymers or a mixed material thereof so as to configure an electrode circuit.

12. The method for manufacturing the three-dimensional electronic device through the polymer frame solvent-plasticizing process according to claim 6,
wherein the step b) includes:
manufacturing the polymer frame having a thickness distribution;
plasticizing the polymer frame by exposing the polymer frame to organic solvent vapor; and
forming a soft layer on a surface of the polymer frame.

13. The method for manufacturing the three-dimensional electronic device through the polymer frame solvent-plasticizing process according to claim 6,
wherein the polymer frame contains any one polymer material selected from the group consisting of acrylonitrile butadiene styrene, poly methyl methacrylate, polyacrylate, polyallylate, polyimide, polyamide, polyamideimide, polycarbonate, polyethylene, polypropylene, polyurethane, polyester, polystyrene, polymethylsilsesquioxane, polyethylene oxide, polyacrylonitrile, polyvinylidene fluoride, polyvinylchloride, polyethersulphone, polyetherimide, polyetheretherketone, polybutadieneterephtalate, polyethylene terephthalate, cellulose triacetate, cellulose acetate propionate, polyisocyanurate, polymethylsilsesquioxane, polyphenylene sulfide, and polyethylene naphthalate, and
wherein examples of a plasticizing solvent includes any one selected from the group consisting of acetaldehyde, acetic acid, acetone, acetonitrile, acetophenetidin, acetophenone, acetylacetone, acetyl chloride, acetyl nitrate, acetylnitrile, acetylonitrile, allyl alcohol, allyl chloride, amines, ammonia, ammonium fluoride, amyl acetate, amyl chloride, aniline, aniline chlorohydrate, aqua regia, aromatic hydrocarbons, asphalt, benzaldehyde, benzene, benzenesulfonic acid, benzyl acetate, benzyl alcohol, benzyl chloride, bromine, butadiene, butane, butyl acetate, butyl acrylate, butyl alcohol, butyl chloride, butyl ether, butyl phenol, boron fluids, bromoform, bromotoluene, butadiene-2,4-p-methoxy, butyl phthalate, butylene, butyric acid, calcium bisulfide, calcium chloride, calcium hydroxide, calcium hypochlorite, camphor oil, carbon monoxide, carbon disulfide, carbon tetrachloride, caustic soda, chloric acid, chlorine, chloroacetic acid, chlorobenzene, chloroform, chlorosulfonic acid, chrome alum, chromic acid, copper cyanide, copper fluoborate, creosols, creosylic acid, cresol, cyclohexane, cyclohexanol, cyclohexanone, decahydronaphthalene, di(butoxyethyl) phthalate, dibutyl phthalate, dichloroethane, dichlorobenzene, dichloroethylene, diethyl ether, diethylamine, dimethylamine, dimethylformamide, dioctyl phthalate, ethers, ethyl acetate, ethyl alcohol, ethylbenzene, ethyl ether, ethylene chloride, ethylene chlorohydrin, ethylenediamine, ethylene glycol, ethylene oxide, fatty acids, fluorine gas, formaldehyde, Freon 12, furfuryl alcohol, gasoline, gelatin, glucose, glycerine, heptane, hydrobromic acid, hydrochloric acid, hydrocyanic acid, hydrofluoric acid, hydrogen peroxide, hydrogen sulfide, iodine, isobutane, isopropyl acetate, isopropyl alcohol, isopropyl ether, lactic acid, lanolin, lead acetate, linseed oil, magnesium chloride, magnesium salts, mercury salts, methane, methyl acetate, methyl alcohol, methylamine, methyl bromide, methylene chloride, methylsulfuric acid, morpholine, naphtha, naphthalene, nickel nitrate, nitric acid, nitrobenzene, oleic acid, olive oil, oxygen gas, ozone, palmitic acid, paraffin, perchloric acid, perchloroethylene, petroleum, phenylhydrazine, phosgene gas, phosgene liquid, phosphoric acid, phosphorus trichloride, phosphorus oxychloride, phosphorus pentachloride, potassium bicarbonate, potassium borate, potassium bromate, potassium bromide, potassium carbonate, potassium chloride, potassium cyanide, potassium ferricyanide, potassium perchlorate, potassium permanganate, potassium persulfate, potassium sulfate, propane, propanol, propargyl alcohol, propionic acid, propyl alcohol, propylene oxide, pyridine, silicone oil, silver nitrate, sodium acetate, sodium benzoate, sodium bicarbonate, sodium bisulfate, sodium bisulfite, sodium chlorate, sodium chloride, sodium chromate, sodium ferrocyanide, sodium hypochlorite, sodium iodide, sodium oxalate, sodium phosphate, sodium sulfide, stannous chloride, stearic acid, sulfur dioxide, sulfuric acid, sulfurous acid, tartaric acid, tetrachloroethane, tetraethyl lead, tetrahydrofuran, thionyl chloride, toluene, transformer oil, trichloroacetic acid, trichloroethylene, triethanolamine, triethylamine, turpentine, urea, uric acid, Vaseline, vinyl acetate, deionized water, xylene, and zinc salts, and a solvent containing any one thereof as a component.

\* \* \* \* \*